United States Patent
Tang et al.

(10) Patent No.: US 7,648,858 B2
(45) Date of Patent: Jan. 19, 2010

(54) METHODS AND APPARATUS FOR EMI SHIELDING IN MULTI-CHIP MODULES

(75) Inventors: Jinbang Tang, Chandler, AZ (US); Jong-Kai Lin, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 92 days.

(21) Appl. No.: 11/765,170

(22) Filed: Jun. 19, 2007

(65) Prior Publication Data

US 2008/0315371 A1    Dec. 25, 2008

(51) Int. Cl.
*H01L 21/00* (2006.01)
*H01L 23/552* (2006.01)
*H01L 23/12* (2006.01)
*H01L 23/053* (2006.01)

(52) U.S. Cl. .............. 438/124; 438/119; 438/122; 438/123; 438/125; 438/126; 438/127; 257/422; 257/659; 257/660; 257/701

(58) Field of Classification Search .......... 257/422, 257/659–660, 701; 438/119, 122–127
See application file for complete search history.

(56) References Cited

U.S. PATENT DOCUMENTS

| | | | |
|---|---|---|---|
| 4,746,389 A * | 5/1988 | DiGenova | 156/247 |
| 5,639,989 A | 6/1997 | Higgins, III | |
| 6,601,293 B1 | 8/2003 | Glenn | |
| 6,677,522 B1 | 1/2004 | Carey et al. | |
| 6,774,493 B2 | 8/2004 | Capote et al. | |
| 6,822,880 B2 | 11/2004 | Kovacs et al. | |
| 6,838,776 B2 | 1/2005 | Leal et al. | |
| 6,921,975 B2 | 7/2005 | Leal et al. | |
| 6,989,593 B2 * | 1/2006 | Khan et al. | 257/707 |
| 7,013,558 B2 | 3/2006 | Bachman | |
| 7,145,084 B1 | 12/2006 | Sarihan et al. | |
| 7,269,472 B2 | 9/2007 | Ammi | |
| 2001/0013650 A1 | 8/2001 | Goetz et al. | |
| 2005/0046001 A1 | 3/2005 | Warner | |
| 2005/0067676 A1 | 3/2005 | Mahadevan et al. | |
| 2006/0214288 A1 * | 9/2006 | Ohsumi | 257/724 |

OTHER PUBLICATIONS

International Search Report and Written Opinion for correlating PCT Patent Application No. PCT/US2008/064186 dated Sep. 30, 2008.

* cited by examiner

*Primary Examiner*—David Vu
*Assistant Examiner*—Arman Khosraviani
(74) *Attorney, Agent, or Firm*—Ingrassia, Fisher & Lorenz, P.C.

(57) ABSTRACT

Methods and structures provide a shielded multi-layer package for use with multi-chip modules and the like. A substrate (102) (e.g., chip carrier) has an adhesive layer (104), where electronic components (106, 108) are attached. An insulating layer (110) is formed over the plurality of electronic components, and a conductive encapsulant structure (115) is formed over the insulating layer. The adhesive layer is detached from the electronic components, and multi-layer circuitry (140) is formed over, and in electrical communication with, the plurality of electronic components. A shielding via (150) is formed through the multilayer circuitry such that it contacts the conductive encapsulant.

12 Claims, 4 Drawing Sheets

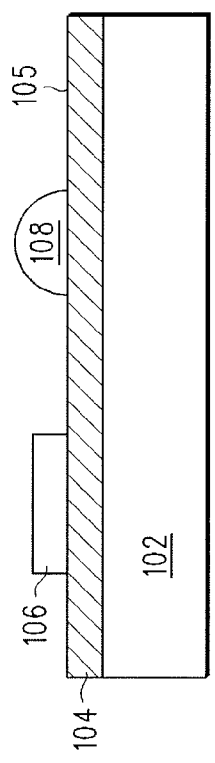
FIG. 1
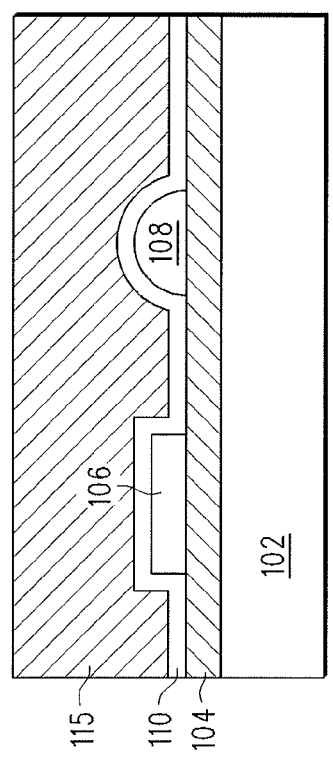
FIG. 3
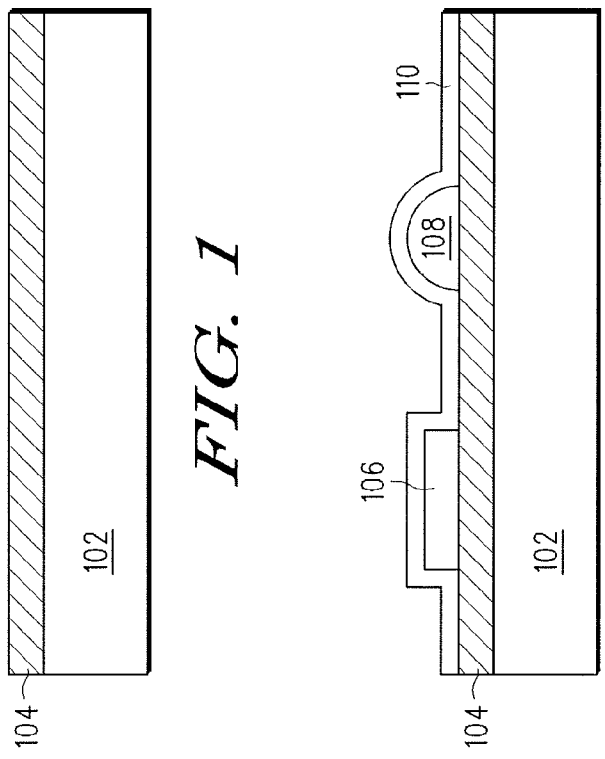
FIG. 5
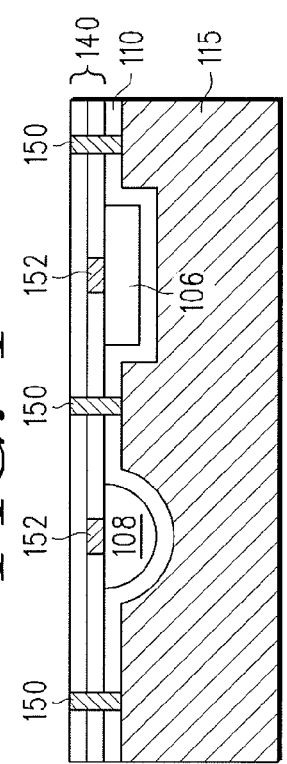
FIG. 2
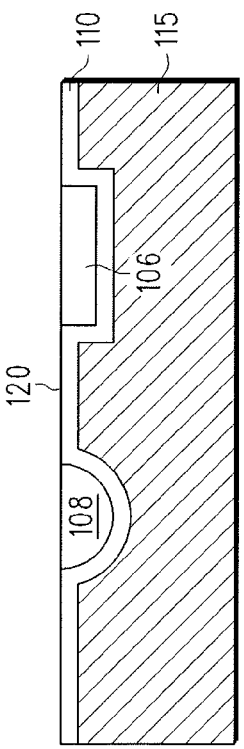
FIG. 4
FIG. 6

METHODS AND APPARATUS FOR EMI SHIELDING IN MULTI-CHIP MODULES

FIELD OF THE INVENTION

The present invention generally relates to semiconductor assemblies and, more particularly, to methods of providing electromagnetic shielding for multi-chip modules and related packages.

BACKGROUND OF THE INVENTION

Semiconductor devices continue to decrease in size and increase in power-density, resulting in a number of challenges for system designers. One of the primary challenges relates to electromagnetic interference (EMI)—i.e., how to shield the internal components from each other as well as from external sources. Such shielding is particularly important in the context of multi-chip and multi-module RF integration.

Chip-to-chip and module-to-module shielding is often provided using an embedded shield structure, a metal can cover, conformal shielding structures, or the like. However, such solutions tend to increase the size of the component, and generally require additional processing steps and cost.

Accordingly, there is a need for high-performance, low-cost shielding techniques for use with multi-chip and multi-module assemblies. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements, and FIGS. 1-6 depict an example process for manufacturing a multi-chip module in accordance with one embodiment;

DETAILED DESCRIPTION OF THE INVENTION

Figure 7:
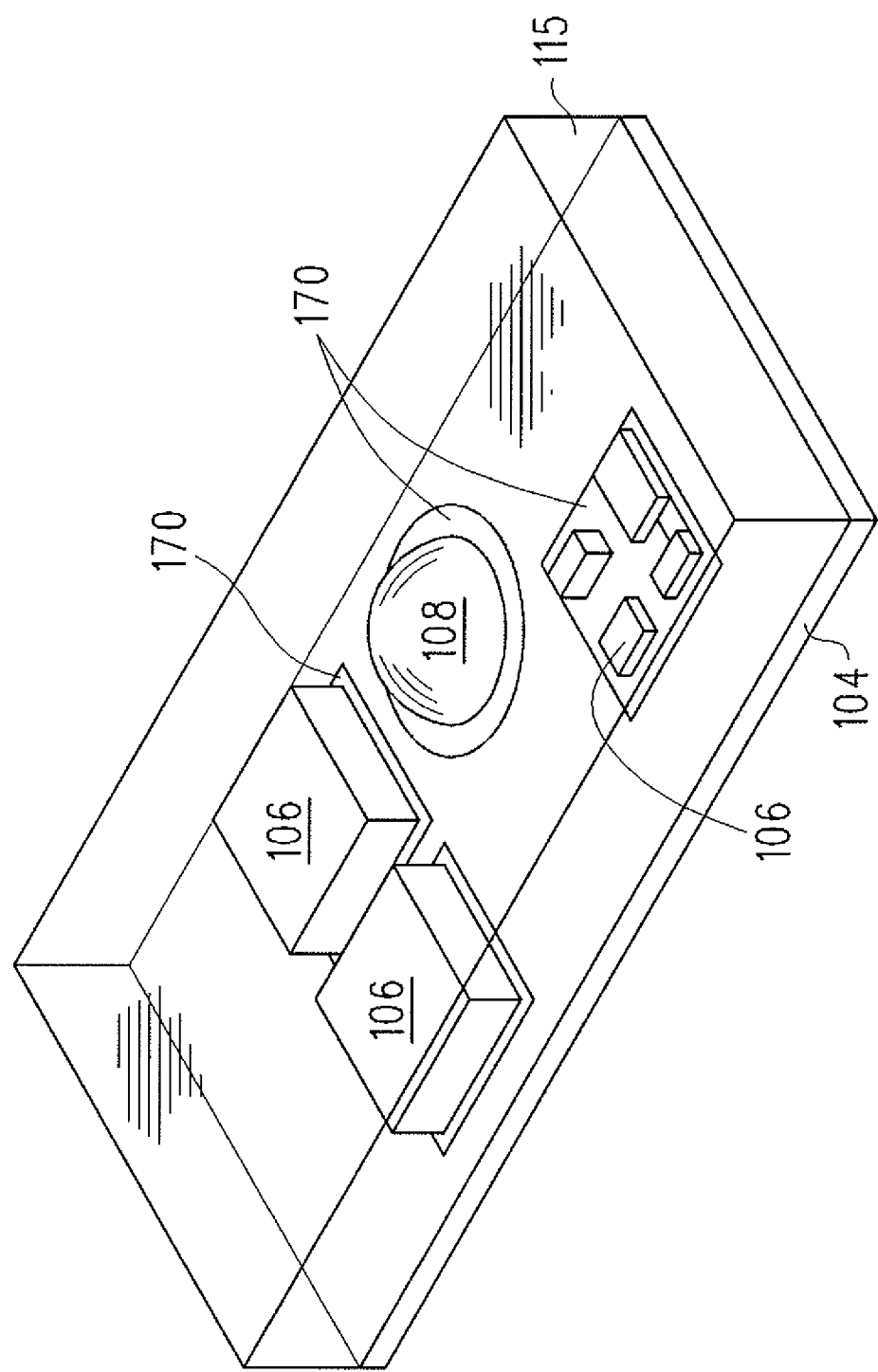
FIG. 7 is an isometric overview of a multi-chip module in accordance with one embodiment and at one point in the process depicted in FIGS. 1-6.

The following detailed description is merely exemplary in nature and is not intended to limit the invention or the application and uses of the invention. Furthermore, there is no intention to be bound by any expressed or implied theory presented in the preceding technical field, background, or the following detailed description. For the sake of brevity, conventional techniques related to semiconductor processing, electronic packaging, and device assembly are not described herein.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein. Unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically.

The terms "comprise," "include," "have" and any variations thereof are used synonymously to denote non-exclusive inclusion. The terms "left," "right," "in," "out," "front," "back," "up," "down," and other such directional terms are used to describe relative positions, not necessarily absolute positions in space. The term "exemplary" is used in the sense of "example," rather than "ideal."

In general, the present invention relates to methods and structures for shielding semiconductor packages using conductive molding compound such that both local and global shielding can be achieved. Referring to the simplified cross-sectional illustrations shown in FIGS. 1-6, an exemplary EMI shielding method will now be described.

As shown in FIG. 1, a carrier structure or "substrate" 102 having an adhesive layer (e.g., an adhesive tape) 104 is provided. Next, as shown in FIG. 2, one or more electronic components (106, 108, etc.) are attached to surface 105 of adhesive layer 104. These electronic components may be RF components, microprocessors, capacitors, resistors, or any other type of active or passive component, depending upon the particular application. In the illustrated embodiment, a "glob top" surface acoustic wave (SAW) structure 108 and semiconductor component 106 are shown. However, the embodiments are not limited as to type or number of components. It will also be appreciated that while an individual multi-layer structure is shown in the figures, it is possible to create multiple structures simultaneously, then singulate individual structures for testing.

As illustrated in FIG. 3, an insulating layer 110 is formed over electronic components 106 and 108 as well as, optionally, any exposed areas of adhesive layer 104. Next, as illustrated in FIG. 4, a conductive molding compound or "encapsulant" 115 is formed over insulating layer 110. Conductive molding compound 115 may comprise any material that provides structural support for the embedded components and at the same time exhibits an electrical conductivity suitable for providing the desired EMI shielding, for example, conductive plastic compounds that contain both plastic and metallic components, which have the electromagnetic properties of metal but can be processed like a plastic.

As shown in FIG. 5, the substrate 102 and adhesive layer 104 have been removed, and for clarity the resulting structure is shown inverted. Thus, what was originally the underside of components 108 and 106 is now exposed, along with portions of insulating layer 110, forming a surface 120.

Next, multilayer circuitry 140 is formed, as shown in FIG. 6, such that it is in electrical communication with the various electrical components. Multilayer circuitry 140 includes various interconnects, dielectrics, multi-layer metallization, and other components that allow electrical communication between layers. In the illustrated embodiment, for example, signal vias 152 are shown contacting components 106 and 108. The processing of such layers is well known in the art.

The size, shape, and thicknesses of the various layers that make up multi-layer structure 140 may be selected to meet any particular design objectives. In one embodiment, for example, layers 140 have a combined thickness of approximately 20 to 200 microns.

Next, as shown in FIG. 6, one or more shielding vias 150 are formed such that they extend through multilayer circuitry 140 and contact conductive encapsulant 115. Shielding vias 150 might consist of conventional plated vias traditionally used in connection with printed circuit board (PCB) technology, or might be metal-filled (e.g., copper-filled) via structures. Furthermore, multiple thermal via layers may be formed by successive plating and etching to form vertical stacks of such vias. The shape, thickness, spacing, density, and size of the vias may vary. For example, they may be spaced in a regular array, a staggered array, a random pattern, or any other suitable configuration.

In this way, the components 106 and 108 are shielded from each other via conductive compound 115 and substrate shielding via 150, which may be in the form of an internal or peripheral via ring.

It will be appreciated that the FIGS. 1-6 are simplified for the purpose of clarity, and that a typical finished structure might also include any number of passive and active components. For example, various baseband ICs, transceivers, power management modules, and the like may be used in an exemplary application. Additional information regarding such embedded chip structures may be found, for example, in U.S. Pat. No. 6,838,776 and U.S. Pat. No. 6,921,975, owned by the present assignee.

In accordance with another embodiment, a local shielding layer may be formed before applying conductive molding compound. Such structures are shown in the isometric view FIG. 7, wherein components 106, 108 are attached to conductive non-contiguous shielding regions 170. Such shielding layer may comprise epoxy, ceramic, or the like. In a further embodiment, a top shielding layer may be formed on the conductive encapsulant 115 if, for example, the components are exposed after a thinning process.

Figure 8:
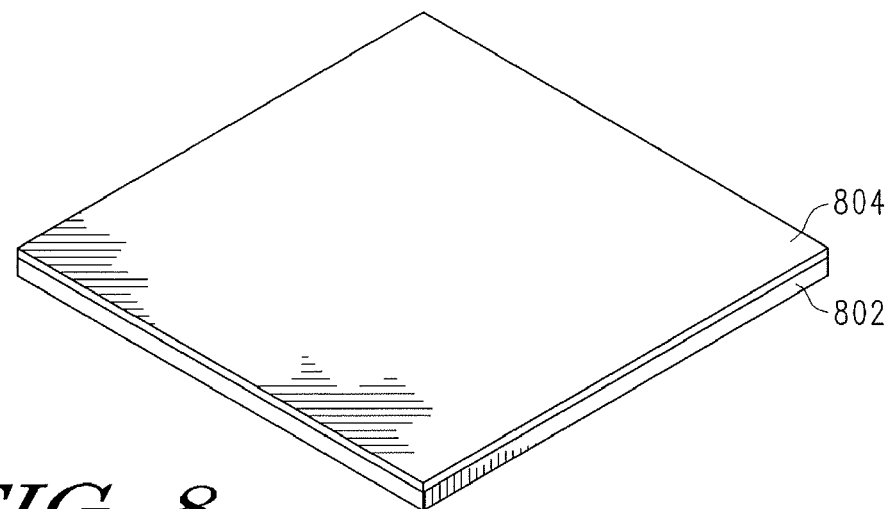
FIGS. 8-13 depict an example process for manufacturing a middle panel layer in accordance with one embodiment.
Figure 9:
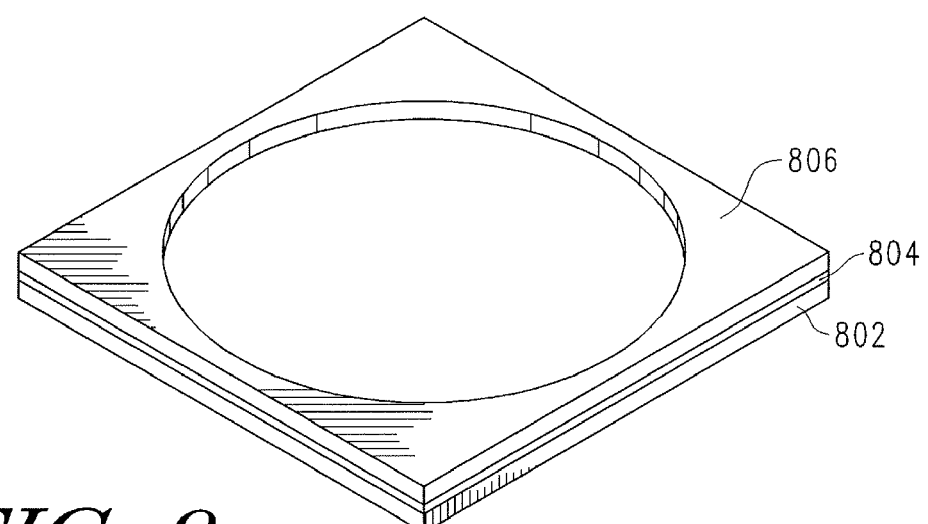
Figure 10:
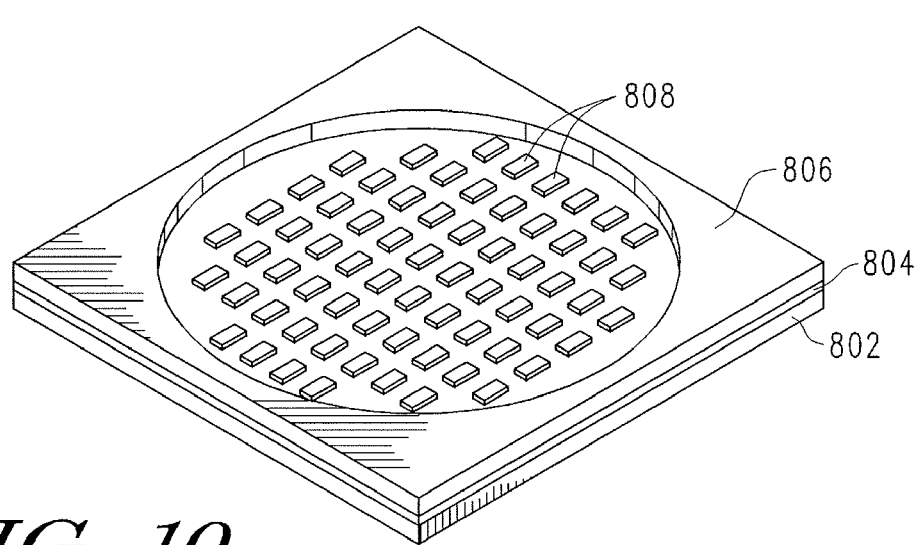

While the present invention may be used in conjunction with a number of different packages and processes, one such process is redistributed chip package (RCP) process. Referring to the simplified process illustrated in the isometric diagrams of FIGS. 8-13, a substrate 802 is coated with an adhesive 804 (FIG. 8). Next, a mold frame 806 is secured to the surface of the adhesive 804 (FIG. 9), and a number of die 808 (or other electronic components) of the same or varying types are placed, active side down, along with one or more other components, in a predetermined pattern on tape 804 (FIG.10). An insulating layer, as previously described, may be formed over components 808 at this point.

Figure 11:
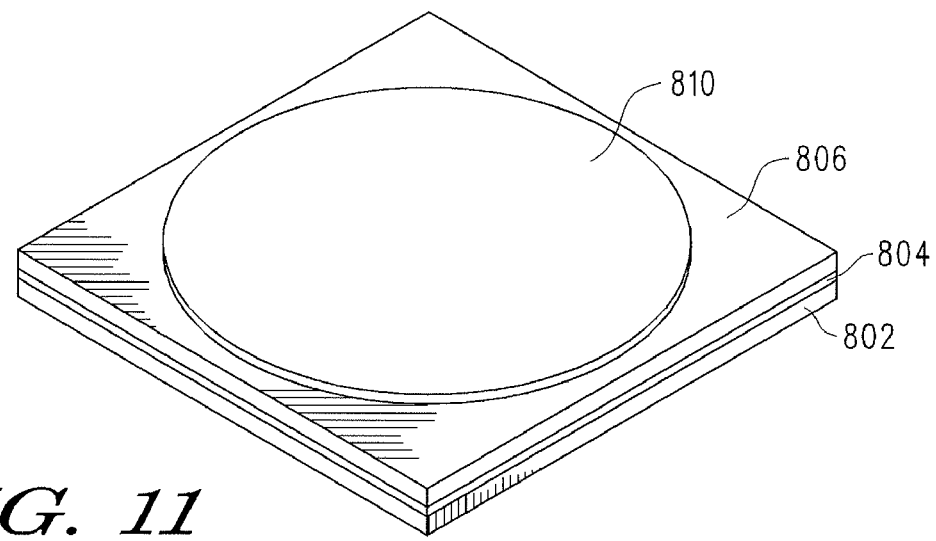
Figure 12:
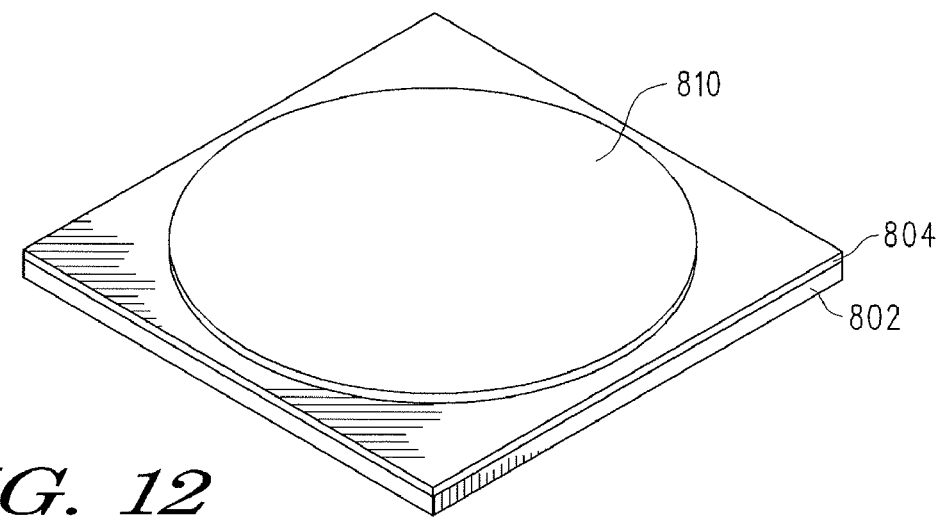
Figure 13:
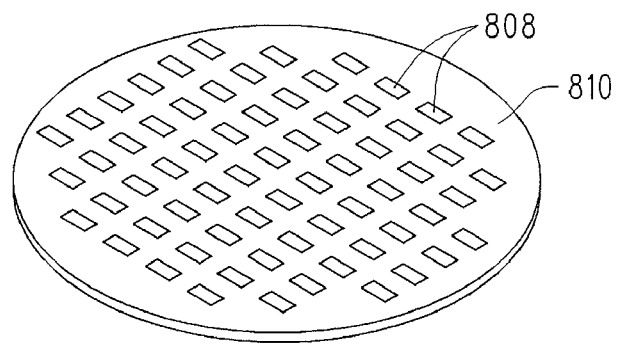

An epoxy or other encapsulant material 810 (e.g., a conductive epoxy) is deposited onto the assembly such that it covers die 808 and substantially fills up the space therebetween (FIG. 11). Next, mold frame 806 is removed (FIG. 12). The surface of encapsulant 810 can be ground down to the desired thickness, where layer 115 still covers the top of the components. Then, layers 804 and 802 are released, the panel is cleaned, and the backside (device I/O) surface of the individual die or other components 808 are exposed (FIG. 13). The resulting panel layer structure is then suitably processed (for example, as discussed herein with respect to the embodiment of FIG. 6) to form build-up layers or other multi-layer structures, including vias and the like, using conventional methods. It will be appreciated that various additional steps involving cleaning, curing, and/or baking might also be performed at various times in the process.

In accordance with one embodiment, a method of manufacturing a multi-layer package structure includes: providing a substrate having an adhesive layer thereon; attaching a plurality of electronic components to the adhesive layer; forming an insulating layer over the plurality of electronic components; forming a conductive encapsulant structure over the insulating layer; detaching the adhesive layer from the electronic components; forming multi-layer circuitry over, and in electrical communication with, the plurality of electronic components; and forming a shielding via through the multilayer circuitry such that it contacts the conductive encapsulant. The method may further include forming a local insulating layer on the adhesive layer prior to forming the conductive encapsulant. Another embodiment further includes reducing the thickness of the conductive encapsulant layer. In another, the method further includes the step of forming a top shielding layer on the conductive encapsulant structure. In one embodiment, the conductive encapsulant comprises conductive plastic mold compound. In another, forming the insulating layer includes depositing a polymer layer. Forming the multilayer circuitry may include forming at least one signal via for transmitting signals between the plurality of components.

A shielded multi-layer package structure in accordance with one embodiment comprises: a conductive encapsulant structure; a plurality of electronic components embedded within the conductive encapsulant structure, wherein an insulating layer is provided between the conductive encapsulant structure and the electronic components; multi-layer circuitry provided on and in electrical communication with the plurality of electronic components; and at least one shielding via extending through the multilayer circuitry such that it contacts the conductive encapsulant. The package may further include a local insulating cover layer between at least one of the plurality of electronic components and the conductive encapsulant. Another embodiment further includes a top shielding layer provided on the conductive encapsulant structure. In a further embodiment, the conductive encapsulant comprises a conductive plastic mold compound. In one embodiment, forming the insulating layer includes depositing a polymer layer.

A method of shielding a plurality of electronic components from electromagnetic interference (EMI) includes: embedding the plurality of electronic components within a conductive encapsulant structure such that insulating layer is provided between the conductive encapsulant structure and the electronic components; and forming at least one shielding via in electrical contact with the conductive encapsulant. A method further includes forming multi-layer circuitry in electrical communication with the plurality of electronic components. In another embodiment, the method further includes forming a local insulating layer between at least one of the plurality of electronic components and the conductive encapsulant. In another embodiment, forming the local shielding layer includes forming a layer of epoxy or ceramic. A top shielding layer may be provided on the conductive encapsulant structure. In various embodiments, the conductive encapsulant may comprise a material selected from the group consisting of aluminum, copper, nickel iron, tin, and zinc. In one embodiment, the insulating layer is provided by depositing a polymer layer. In another, depositing the polymer layer includes depositing a polyimide layer.

The exemplary embodiment or exemplary embodiments presented above are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method of manufacturing a multi-layer package structure, comprising:
   providing a substrate having an adhesive layer thereon;
   attaching first surfaces of a plurality of electronic components to the adhesive layer, wherein the plurality of electronic components have the first surfaces and second surfaces that are opposite the first surfaces;
   forming an insulating layer with first portions disposed in contact with the second surfaces of the plurality of electronic components and with second portions disposed in contact with the adhesive layer;
   forming an electrically conductive encapsulant structure over the insulating layer, resulting in a structure in which the first portions of the insulating layer are positioned between the conductive encapsulant structure and the second surfaces of the plurality of electronic components, and in which the second portions of the insulating layer are positioned between the adhesive layer and the conductive encapsulant structure;
   detaching the adhesive layer from the first surfaces of the plurality of electronic components and the second portions of the insulating layer;
   forming multi-layer circuitry over, and in electrical communication with, the first surfaces of the plurality of electronic components; and
   forming a shielding via through the multilayer circuitry and the second portions of the insulating layer such that the shielding via directly contacts the conductive encapsulant structure.

2. The method of claim 1, further including forming a local insulating layer on the adhesive layer prior to forming the conductive encapsulant.

3. The method of claim 1, further including reducing the thickness of the conductive encapsulant layer.

4. The method of claim 1, wherein the conductive encapsulant comprises conductive plastic mold compound.

5. The method of claim 1, wherein forming the insulating layer includes depositing a polymer layer.

6. The method of claim 1, wherein forming the multilayer circuitry includes forming at least one signal via for transmitting signals between the plurality of components.

7. A method of shielding a plurality of electronic components from electromagnetic interference (EMI), wherein the plurality of electronic components have first surfaces and second surfaces that are opposite the first surfaces, comprising:
   embedding the plurality of electronic components within an electrically conductive encapsulant structure such that first portions of an insulating layer are provided between the electrically conductive encapsulant structure and the second surfaces of the electronic components, and such that second portions of the insulating layer are provided between the plurality of electronic components and coplanar with the first surfaces;
   forming at least one shielding via through the second portions of the insulating layer and in electrical contact with the electrically conductive encapsulant structure; and
   forming multi-layer circuitry over, and in electrical communication with, the first surfaces of the plurality of electronic components, wherein the at least one shielding via directly contacts the electrically conductive encapsulant structure through the multi-layer circuitry and the second portions of the insulating layer.

8. The method of claim 7, further including forming a local insulating layer between at least one of the plurality of electronic components and the conductive encapsulant.

9. The method of claim 7, wherein forming the local shielding layer includes forming a layer of epoxy or ceramic.

10. The method of claim 7, wherein the conductive encapsulant comprises a material selected from the group consisting of aluminum, copper, nickel iron, tin, and zinc.

11. The method of claim 7, wherein the insulating layer is provided by depositing a polymer layer.

12. The method of claim 10, wherein depositing the polymer layer includes depositing a polyimide layer.

* * * * *